(12) United States Patent
Kim et al.

(10) Patent No.: US 7,617,097 B2
(45) Date of Patent: Nov. 10, 2009

(54) SCALABLE LOSSLESS AUDIO CODING/DECODING APPARATUS AND METHOD

(75) Inventors: Doh-hyung Kim, Kyungki-do (KR); Sang-wook Kim, Seoul (KR); Jung-hoe Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 740 days.

(21) Appl. No.: 10/366,348

(22) Filed: Feb. 14, 2003

(65) Prior Publication Data

US 2003/0171919 A1 Sep. 11, 2003

(30) Foreign Application Priority Data

Mar. 9, 2002 (KR) ................. 2002-12759

(51) Int. Cl.
*G10L 19/02* (2006.01)
(52) U.S. Cl. ..................................... 704/219
(58) Field of Classification Search ................. 704/229, 704/500–504
See application file for complete search history.

(56) References Cited

U.S. PATENT DOCUMENTS

| | | | | |
|---|---|---|---|---|
| 5,777,677 | A * | 7/1998 | Linzer et al. | 375/240.11 |
| 6,094,636 | A * | 7/2000 | Kim | 704/500 |
| 6,349,284 | B1 * | 2/2002 | Park et al. | 704/500 |
| 6,498,811 | B1 | 12/2002 | Van Der Vleuten | |
| 6,529,604 | B1 | 3/2003 | Park et al. | |
| 6,549,147 | B1 * | 4/2003 | Moriya et al. | 341/50 |
| 6,677,868 | B2 * | 1/2004 | Kerofsky et al. | 341/107 |

(Continued)

FOREIGN PATENT DOCUMENTS

EP 918407 A2 5/1999

(Continued)

OTHER PUBLICATIONS

Moriya, Takehiro et al.; A Design of Lossy and Lossless Scalable Audio Coding; Acoustics, Speech, and Signal Processing, 2000. ICASSP '00. Proceedings 2000 International Conference on; vol. 2, 5-9 Jun. 2000, pp. 11889-11892 vol. 2.*

(Continued)

*Primary Examiner*—Michael N Opsasnick
(74) *Attorney, Agent, or Firm*—Staas & Halsey LLP (57) ABSTRACT

A scalable lossless audio coding/decoding apparatus and method are provided. The scalable lossless audio coding apparatus includes a lossy coding unit which lossy codes an input audio signal and generates a lossy bitstream, a lossy signal regenerating unit which decodes the lossy bitstream, compares a decoded signal with the input audio signal, and regenerates a lossy signal that is lost when lossy coding is implemented, a lossless coding unit which lossless codes the lossy signal and generates the result of lossless coding as a lossless bitstream, and a multiplexing unit which multiplexes the lossy bitstream with the lossless bitstream and generates one output bitstream. The lossy-coded lossy bitstream is mixed with the lossless-coded lossless bitstream, thereby one output bitstream is generated and transmitted, and the lossy audio signal in which only the lossy bitstream is restored from the output bitstream or the lossless audio signal in which the lossy bitstream and the lossless bitstream are restored and mixed with each other can be selectively generated.

15 Claims, 5 Drawing Sheets

U.S. PATENT DOCUMENTS

| | | | |
|---|---|---|---|
| 6,993,198 B2 | 1/2006 | Kishi | |
| 2002/0018572 A1* | 2/2002 | Rhoads | 381/1 |

FOREIGN PATENT DOCUMENTS

| | | |
|---|---|---|
| EP | 1 173 028 A2 | 1/2002 |
| JP | 03-108824 A | 5/1991 |
| JP | 11-317672 | 11/1999 |
| JP | 2001-044847 | 2/2001 |
| JP | 2002-016925 | 1/2002 |
| JP | 2002504294 T | 2/2002 |
| WO | WO 99/53677 A2 | 10/1999 |

OTHER PUBLICATIONS

Japanese Patent Office Action issued Jan. 4, 2006.

Official Action issued by the Japanese Patent Office in corresponding JP Application No. 2003-052519, mailed Feb. 6, 2007.

Office Action issued by German Patent Office on Apr. 21, 2008.

Noll et al., "Digital Audio: From Lossless to Transparent Coding", IEEE Signal Processing Workshop, 1999.

Moriya et al., "A Design of Lossy and Lossless Scalable Audio Coding", Acoustics, Speech and Signal Processing, 2000 IEEE International Conference, vol. 2, Jun. 5-9, 2000, pp. 889-892.

Grill, "A Two-or Three-Stage Bit Rate Scalable Audio Coding System", AES, Preprint 4132, 99th Convention, Oct. 6-9, 1995, New York.

* cited by examiner

SCALABLE LOSSLESS AUDIO CODING/DECODING APPARATUS AND METHOD

BACKGROUND OF THE INVENTION

This application claims the priority of Korean Patent Application No. 2002-12759, filed on Mar. 9, 2002, which is incorporated herein in its entirety by reference.

1. Field of the Invention

The present invention relates to an audio coding/decoding system, and more particularly, to a scalable lossless audio coding/decoding apparatus and method which can implement a switching function of a lossy bitstream and a lossless bitstream.

2. Description of the Related Art

Since the use of MP3 techniques started, many other MPEG techniques have been used all over the world. In most MPEG techniques, a very small amount of information is compressed, compared to an original signal, and loss compression usually accompanies data loss. That is, the size of coded information is reduced greatly, but coded information is not completely the same as original sound. However, if an Internet environment is changed from narrow band into wide band and very large capacity transmission lines such as wireless and optical communications are constructed soon, users' desires to receive clearer sound services will increase. Preparing for this trend, a MPEG standardization organization creates an atmosphere for lossless coding standardization, and lossless coding/decoding apparatuses therefor need to be provided. In addition, for a variety of services, a scalable function which can selectively provide a lossy-coded bitstream or lossless-coded bitstream is required.

Figure 1:
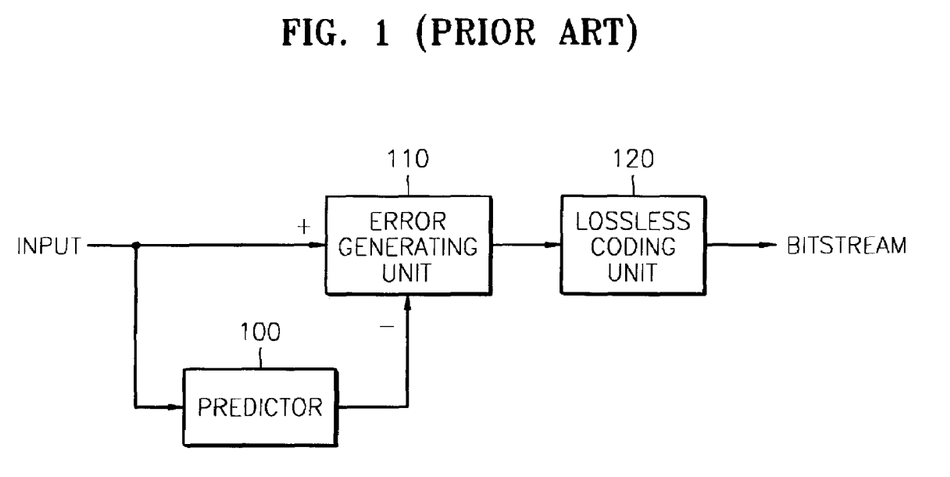
FIG. 1 shows a block diagram of a conventional lossless coding apparatus.

FIG. 1 shows a block diagram of a conventional lossless coding apparatus. Referring to FIG. 1, a predictor 100 predicts an input audio signal to be input next from an input audio signal INPUT that has been presently input.

An error generating unit 110 compares the input audio signal INPUT with the signal that is predicted by the predictor 100, detects an error between the two signals, and outputs the result of detection as an error signal.

A lossless coding unit 120 lossless codes the error signal that is output from the error generating unit 110 and generates a lossless bitstream.

However, a scalable function cannot be provided by the conventional lossless coding apparatus shown in FIG. 1. In order to provide the scalable function, a lossy bitstream and a lossless bitstream should be generated separately, stored in a separate storage space, and served through switching. In this case, two data should be simultaneously stored in a server's storage unit, and thus a relatively large capacity storage space is necessary, increasing costs.

SUMMARY OF THE INVENTION

The present invention provides a lossless audio coding/decoding apparatus having a scalable function which can selectively provide a lossy-coded bitstream or lossless-coded bitstream.

The present invention further provides a lossless audio coding/decoding method having a scalable function which can selectively provide a lossy-coded bitstream or lossless-coded bitstream.

According to one aspect of the present invention, there is provided a scalable lossless audio coding apparatus. The apparatus includes a lossy coding unit which lossy codes an input audio signal and generates a lossy bitstream, a lossy signal regenerating unit which decodes the lossy bitstream, compares a decoded signal with the input audio signal, and regenerates a lossy signal that is lost when lossy coding is implemented, a lossless coding unit which lossless codes the lossy signal and generates the result of lossless coding as a lossless bitstream, and a multiplexing unit which multiplexes the lossy bitstream with the lossless bitstream and generates one output bitstream.

According to another aspect of the present invention, there is provided a scalable lossless audio decoding apparatus for decoding an audio signal from a bitstream in which a lossy bitstream, in which the audio signal is lossy coded, and a lossless bitstream, in which a lossy audio signal that is lost when the audio signal is lossy coded is lossless coded, are mixed together. The apparatus includes a demultiplexing unit which demultiplexes the lossy bitstream and the lossless bitstream from the mixed bitstream, a lossy decoding unit which decodes the lossy bitstream that is separated from the demultiplexing unit and restores the audio signal, a lossless decoding unit which restores the lossless bitstream that is separated from the demultiplexing unit and restores the lossy signal, and a first signal generator which adds the lossy audio signal that is restored by the lossy decoding unit to the restored lossy signal and restores a lossless audio signal.

According to another aspect of the present invention, there is provided a scalable lossless audio coding method. The method comprises (a) lossy coding an input audio signal and generating a lossy bitstream, (b) decoding the lossy bitstream, comparing a decoded signal with the input audio signal, and regenerating a lossy signal that is lost when lossy coding is implemented, (c) lossless coding the lossy signal and generating the result of lossless coding as a lossless bitstream, and (d) multiplexing the lossy bitstream with the lossless bitstream and generating one output bitstream.

According to another aspect of the present invention, there is provided a scalable lossless audio decoding method for decoding an audio signal from a bitstream in which a lossy bitstream, in which the audio signal is lossy coded, and a lossless bitstream, in which a lossy audio signal that is lost when the audio signal is lossy coded is lossless coded, are mixed together. The method comprises (a) demultiplexing the lossy bitstream and the lossless bitstream from the mixed bitstream, (b) decoding the lossy bitstream that is separated from the demultiplexing unit and restoring the audio signal, (c) restoring the lossless bitstream that is separated from the demultiplexing unit and restoring the lossy signal, and (d) adding the lossy audio signal that is restored by the lossy decoding unit to the restored lossy signal and restoring a lossless audio signal.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, the present invention will be described in detail by describing preferred embodiments of the invention with reference to the accompanying drawings.

Figure 2:
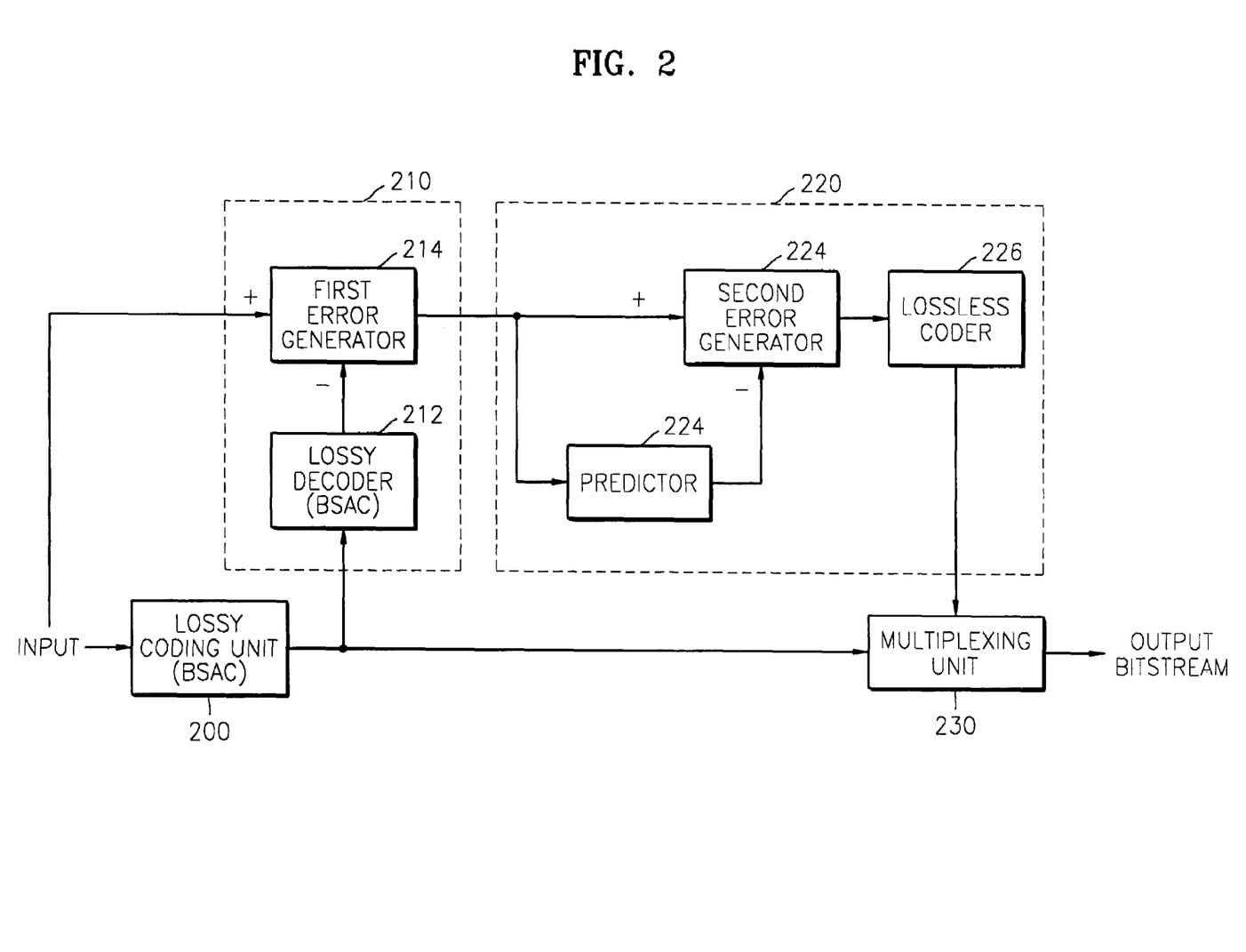
FIG. 2 shows a block diagram illustrating an embodiment of a scalable lossless audio coding apparatus according to the present invention.

FIG. 2 shows a block diagram illustrating an embodiment of a scalable lossless audio coding apparatus according to the present invention. Referring to FIG. 2, the scalable lossless audio coding apparatus includes a lossy coding unit 200, a lossy signal regenerating unit 210, a lossless coding unit 220, and a multiplexing unit 230.

Figure 3A:
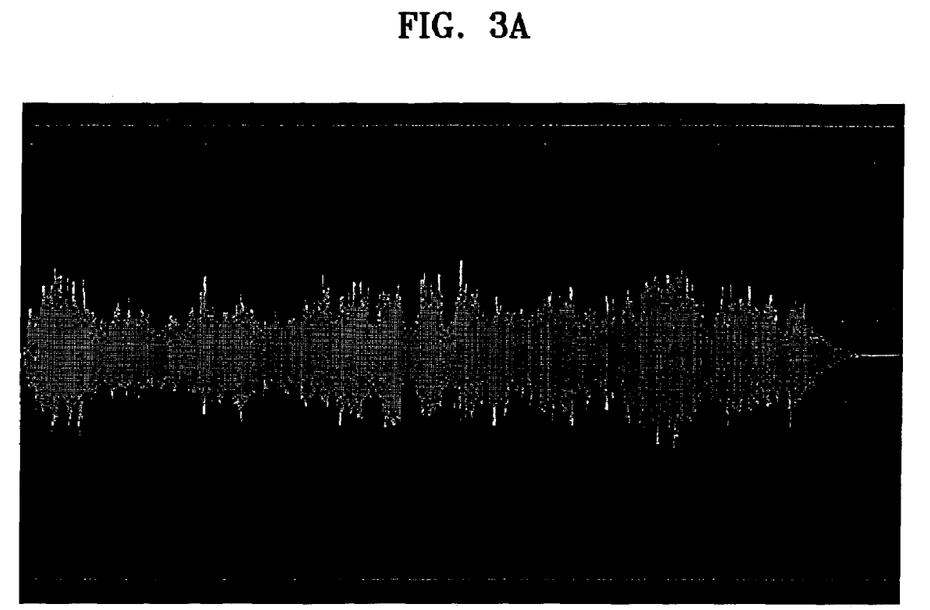
FIGS. 3A through 3C show waveforms of main signals of the apparatus of FIG. 2.
Figure 3B:
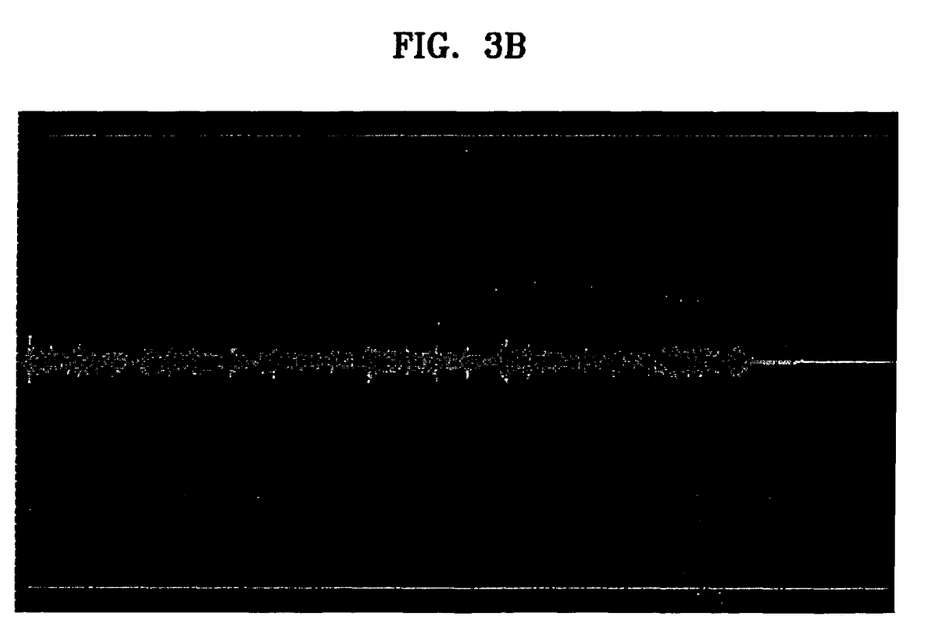
Figure 3C:
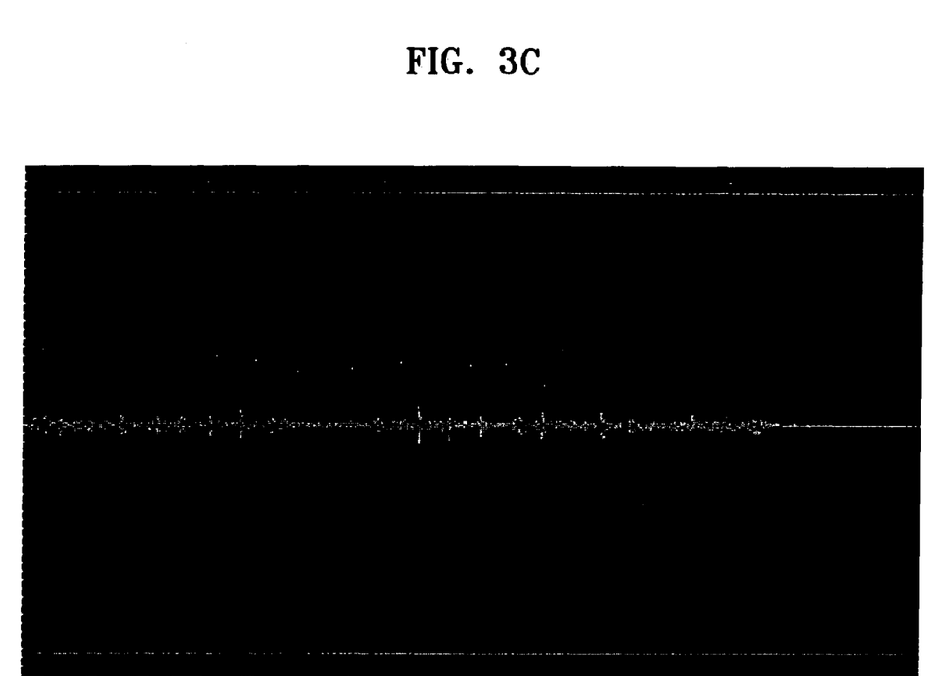

FIGS. 3A through 3C show waveforms of main signals of the apparatus of FIG. 2. FIG. 3A shows an input audio signal INPUT, FIG. 3B shows a lossy signal generated by a first error generator 214, and FIG. 3C shows an error signal generated by a second error generator 224.

Referring to FIGS. 2 and 3, the lossy coding unit 200 lossy codes the input audio signal INPUT and generates a lossy bitstream. In this way, when lossy coding is implemented, part of an audio signal which does not affect human ears is lost. Here, a bit sliced arithmetic coding (BSAC) coder may be used for the lossy coding unit 200.

The lossy signal regenerating unit 210 decodes the lossy bitstream, compares a restored signal with the input audio signal INPUT, and regenerates the audio signal that is lost when lossy-coding is performed by the lossy coding unit 200, as a lossy signal. Preferably, the lossy signal regenerating unit 210 includes a lossy decoder 212 and a first error generator 214.

The lossy decoder 212 decodes the lossy bitstream output from the lossy coding unit 200 and restores the input audio signal INPUT. However, as described above, part of an audio signal is lost when lossy coding is implemented by the lossy coding unit 200. Accordingly, a lossy audio signal, part of which is lost, is restored by the lossy decoder 212. Here, if the lossy coding unit 200 is a BSAC coder, the lossy decoder 212 is preferably a BSAC decoder.

The first error generator 214 compares the input audio signal INPUT with the lossy audio signal that is restored by the lossy decoder 212, detects an error between the two signals, and outputs the result of the detection as a lossy signal.

Subsequently, the lossless coding unit 220 lossless codes the lossy signal output from the lossy signal regenerating unit 210 and generates a lossless bitstream. Preferably, the lossless coding unit 220 includes a predictor 222, a second error generator 224, and a lossless coder 226.

The predictor 222 predicts a lossy signal to be generated next from the present lossy signal that is input from the lossy signal regenerating unit 210. This is because the amount of data to be coded is reduced by removing redundancy between samples existing in the lossy signal. A lossy signal (see FIG. 3B) that is generated by the first error generator 214 is a difference between the input audio signal INPUT (see FIG. 3A) and an audio signal that is quantized by the lossy coding unit 200, and thus the entire root-mean-square (RMS) value is smaller than that of an original signal.

However, the audio signal is not quanitzed identically at each frequency by the lossy coding unit 200, and so there is still time redundancy. Thus, in order to further reduce time redundancy, a final signal is controlled to follow a Laplacian distribution through prediction on a time axis. An autoregressive method or a moving average method may be used as a prediction method. In addition, prediction is possible only using a simple low-degree fixed prediction factor. Thus, a predictor requiring a minimum bit is selected using one selected from an autoregressive method, a moving average method, a simple polynomial prediction method and another prediction method in consideration of an overhead with respect to a prediction factor.

The second error generator 224 compares the lossy signal with a prediction signal that is predicted by the predictor 222, detects an error between the two signals, and outputs the result of the detection as an error signal (see FIG. 3C). In conclusion, as shown in FIG. 3C, the error signal that is generated by the second error generator 224 minimizes a RMS value by minimizing the time redundancy of the lossy signal (see FIG. 3B) that is generated by the first error generator 214, thereby minimizing the amount of data to be coded by the lossless coder 226 which will be described later.

The lossless coder 226 lossless codes the error signal output from the second error generator 224 and generates the lossless bitstream.

Subsequently, the multiplexing unit 230 multiplexes the lossy bitstream output from the lossy coding unit 200 with the lossless bitstream output from the lossless coding unit 220 and generates one output bitstream.

Figure 4:
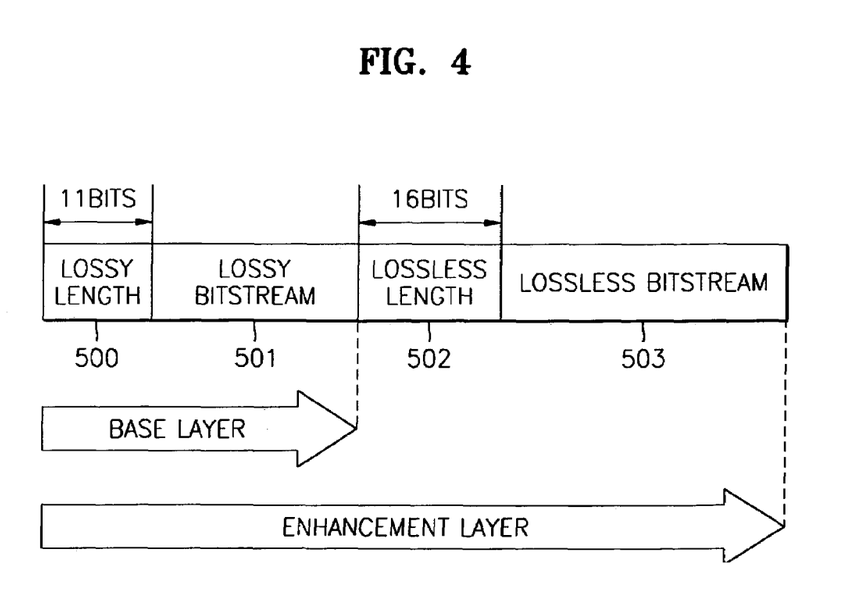
FIG. 4 illustrates the structure of a bitstream output from a multiplexing unit of FIG. 2.

FIG. 4 illustrates the structure of a bitstream output from the multiplexing unit 230 of FIG. 2. Referring to FIG. 4, an output bitstream is comprised of a first length field 500 which represents the length of a frame of a lossy bitstream, a first data field 501 in which the lossy bitstream is recorded, a second length field 502 which represents the length of a frame of a lossless bitstream, and a second data field 503 in which the lossless bitstream is recorded.

In conclusion, the scalable lossless audio coding apparatus of FIG. 2 according to the present invention can generate a lossy-coded base layer and a lossless-coded enhancement layer as one bitstream and then transmit the bitstream.

Figure 5:
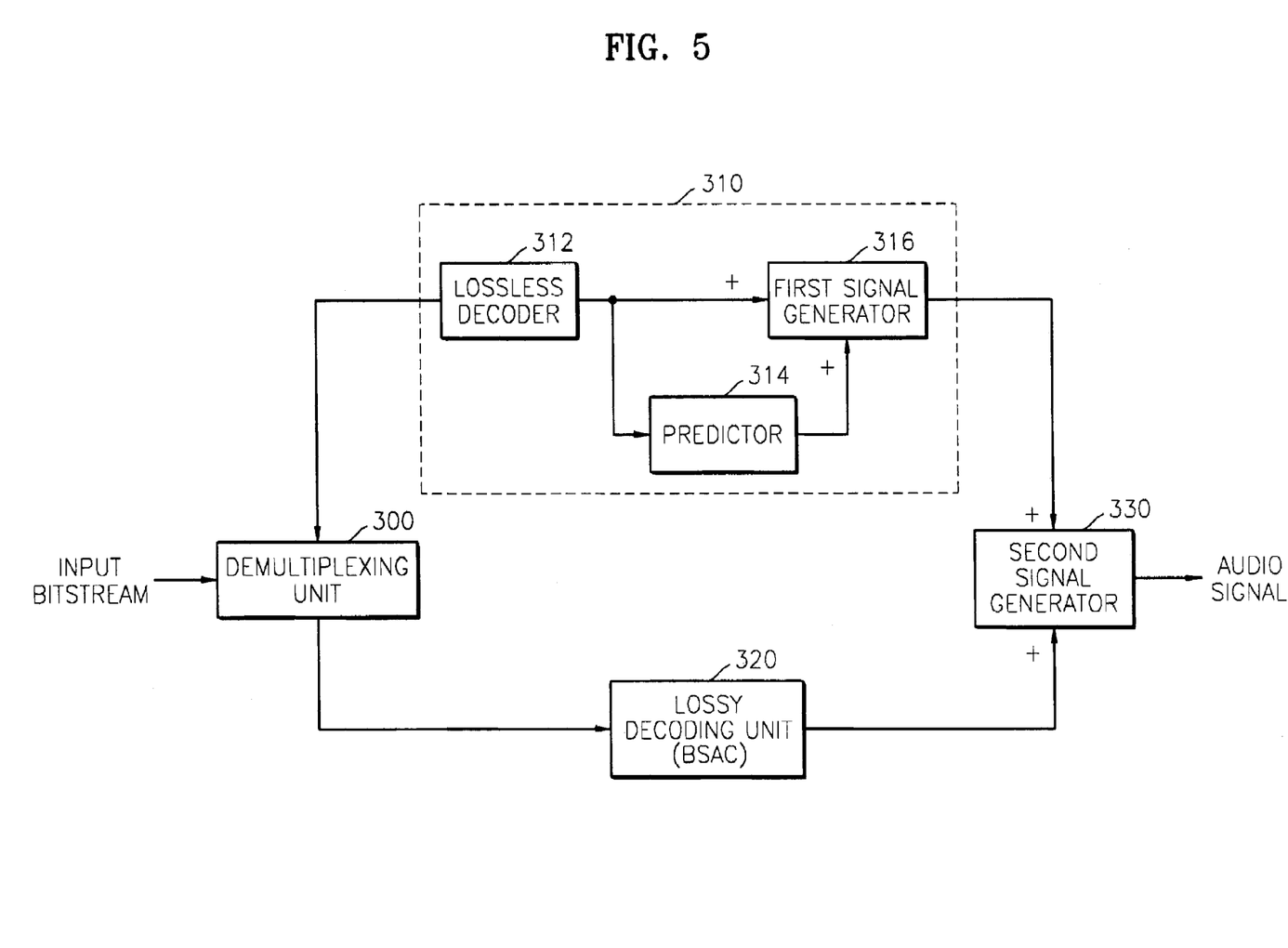
FIG. 5 shows a block diagram illustrating an embodiment of a scalable lossless audio decoding apparatus for decoding an audio bitstream that is coded and output by and from the coding apparatus of FIG. 2, according to the present invention.

FIG. 5 shows a block diagram illustrating an embodiment of a scalable lossless audio decoding apparatus for decoding an audio bitstream that is coded by and output from the coding apparatus of FIG. 2, according to the present invention. The scalable lossless audio decoding apparatus includes a demultiplexing unit 300, a lossless decoding unit 310, a lossy decoding unit 320, and a second signal generator 330.

Referring to FIG. 5, the demultiplexing unit 300 inputs the output bitstream output from the apparatus of FIG. 2 as an input bitstream and separates a lossy bitstream and a lossless bitstream from the input bitstream. That is, the demultiplexing unit 300 inputs the bitstream of the structure shown in FIG. 4, interprets the lossy bitstream length 500, separates the lossy bitstream 501 from the input bitstream, interprets the lossless bitstream length 502, and separates the lossless bitstream 503 from the input bitstream.

The lossy decoding unit 320 decodes the lossy bitstream that is separated from the demultiplexing unit 300 and restores an audio signal. However, as described above, part of an audio signal is lost when lossy coding is implemented by the lossy coding unit 200. Thus, the audio signal, part of which is lost, is restored by the lossy decoding unit 320. Here, if the lossy coding unit 200 is a BSAC coder, the lossy decoding unit 320 is preferably a BSAC decoder.

The lossless decoding unit 310 restores the lossless bitstream that is separated from the demultiplexing unit 300 and restores a lossy signal before it is being coded by the lossless coding unit 220 of FIG. 2. The lossless decoding unit 310 can restore the lossy signal by performing a reverse procedure from that of the lossless coding unit 220. Preferably, the lossless decoding unit 310 includes a lossless decoder 312, a predictor 314, and a first signal generator 316.

The lossless decoder 312 restores the lossless bitstream that is separated from the demultiplexing unit 300 and restores the error signal output from the second error generator 224 of FIG. 2.

The predictor 314 predicts an original signal from the error signal that is restored by the lossless decoder 312.

The first signal generator 316 adds the error signal that is restored by the lossless decoder 312 to the signal that is predicted by the predictor 314 and restores the lossy signal.

Subsequently, the second signal generator 330 adds the lossy audio signal that is restored by the lossy decoding unit 320 to the lossy signal that is restored by the lossless decoding unit 310 and restores a lossless audio signal. That is, the audio signal that is restored by the lossy decoding unit 320 is a signal which is partly lost when the input audio signal INPUT is lossy coded, and the lossy signal that is restored by the lossless decoding unit 310 is an audio signal that is lost when lossy decoding is implemented. As a result, the second signal generator 330 adds the lossy signal to the lossy audio signal that is restored by the lossy decoding unit 320, thereby restoring the input audio signal INPUT.

Meanwhile, the second signal generator 330 can selectively output only the audio signal that is restored by the lossy decoding unit 320 or the lossless audio signal in which the restored lossy signal is added to the restored audio signal, according to external control. For example, a service provider for providing audio services can selectively provide audio services to each user using the scalable lossless decoding apparatus according to the present invention. For example, the service provider can allow a user using a narrow-band network or a non-paying user to regenerate only the lossy audio signal that is restored by the lossy decoding unit 320 and a user using a wide-band network or a paying user to regenerate the lossless audio signal.

In addition, the present invention can be implemented with computer-readable codes of computer-readable recording media. The computer-readable recording media include all kinds of recording apparatuses in which computer-readable data is stored. The computer-readable recording media include ROMs, RAMs, CD-ROMs, magnetic tapes, floppy discs, and optical data storage apparatuses, and further include carrier waves (i.e., transmission via the Internet). The computer-readable recording media are dispersed to a computer system that is connected to a network, and thus computer-readable codes can be stored and executed by a dispersion method.

As described above, according to the scalable lossless audio coding/decoding apparatus and method according to the present invention, the lossy-coded lossy bitstream is mixed with the lossless-coded lossless bitstream, thereby one output bitstream is generated and transmitted, and the lossy audio signal in which only the lossy bitstream is restored from the output bitstream or the lossless audio signal in which the lossy bitstream and the lossless bitstream are restored and mixed with each other can be selectively generated.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A scalable lossless audio coding apparatus comprising:
   a lossy coding unit which lossy codes an input audio signal and generates the result of the lossy coding as a base layer;
   a lossy signal regenerating unit which decodes the base layer, compares a decoded signal with the input audio signal, and regenerates a lossy signal that is lost when the lossy coding is implemented;
   a lossless coding unit which lossless codes the regenerated lossy signal and generates the result of the lossless coding as an enhancement layer, wherein the lossless coding unit comprises;
   a predictor which predicts a lossy signal to be generated next based on the regenerated lossy signal,
   an error generator which compares the regenerated lossy signal with the predicted lossy signal, detects an error between the regenerated lossy signal and the predicted lossy signal, and outputs the result of the detection as an error signal, and
   a lossless coder which lossless codes the error signal to generate the enhancement layer; and
   a multiplexing unit which multiplexes the base layer with the enhancement layer and generates one output bitstream.

2. The apparatus as claimed in claim 1, wherein the output bitstream comprises:
   a first length field which represents the length of a frame of the base layer;
   a first data field in which a lossy bitstream of the base layer is recorded;
   a second length field which represents the length of a frame of the enhancement layer; and
   a second data field in which a lossless bitstream of the enhancement layer is recorded.

3. The apparatus as claimed in claim 1, wherein the lossy coding unit is a bit sliced arithmetic coding (BSAC) coder.

4. The apparatus as claimed in claim 1, wherein the lossy signal regenerating unit comprises:
   a lossy decoder which decodes the base layer and restores the input audio signal; and
   an error generator which compares the input audio signal with the restored lossy audio signal, detects an error between the input audio signal and the restored lossy audio signal, and outputs the result of the detection as the lossy signal.

5. The apparatus as claimed in claim 4, wherein the lossy decoder is a BSAC decoder.

6. A scalable lossless audio decoding apparatus for decoding an audio signal from a bitstream in which a lossy bitstream, in which the audio signal is lossy coded as a base layer, and a lossless bitstream, in which a lossy signal that is lost when the audio signal is lossy coded is lossless coded as an enhancement layer, are mixed together, the apparatus comprising:
   a demultiplexing unit which demultiplexes the base layer and the enhancement layer from the mixed bitstream;
   a lossy decoding unit which decodes the base layer that is separated from the demultiplexing unit and restores the audio signal;
   a lossless decoding unit which decodes the enhancement layer that is separated from the demultiplexing unit and restores the lossy signal, wherein the lossless decoding unit comprises:
   a lossless decoder which restores the lossless bitstream and restores an error signal,
   a predictor which predicts an original signal based on the error signal that is restored by the lossless decoder, and
   a first signal generator which adds the restored error signal to the predicted original signal to generate the restored lossy signal; and a second signal generator which adds the lossy audio signal that is restored by the lossy decoding unit to the lossy signal that is restored by the lossless decoding unit and restores a lossless audio signal.

7. The apparatus as claimed in claim 6, wherein the lossy decoding unit is a bit sliced arithmetic coding (BSAC) decoder.

8. A scalable lossless audio coding method performed by a scalable lossless audio apparatus comprising:
- (a) lossy coding an input audio signal received by the scalable lossless audio coding apparatus and generating the result of the lossy coding as a base layer;
- (b) decoding the base layer, comparing a decoded signal with the input audio signal, and regenerating a lossy signal that is lost when the lossy coding is implemented;
- (c) lossless coding the regenerated lossy signal and generating the result of the lossless coding as an enhancement layer, wherein the lossless coding comprises:
  - (c1) predicting a lossy signal to be generated next based on the regenerated lossy signal,
  - (c2) comparing the regenerated lossy signal with the predicted lossy signal, detecting an error between the regenerated lossy signal and the predicted lossy signal, and outputting the result of the detection as an error signal, and
  - (c3) lossless coding the error signal to generate the enhancement layer; and
- (d) multiplexing the base layer with the enhancement layer and generating one output bitstream.

9. The method as claimed in claim 8, wherein lossy coding in step (a) is implemented using a bit sliced arithmetic coding (BSAC) coder, and decoding of the base layer in step (b) is implemented using a BSAC decoder.

10. A physical recording medium on which the scalable lossless audio coding method as claimed in claim 8 is recorded as a computer executable program code that can be executed by a computer to carry out the steps of the method.

11. A scalable lossless audio decoding method performed by a scalable lossless audio decoding apparatus for decoding an audio signal from a bitstream in which a lossy bitstream, in which the audio signal is lossy coded as a base layer, and a lossless bitstream, in which a lossy signal that is lost when the audio signal is lossy coded is lossless coded as an enhancement layer, are mixed together, the method comprising:
- (a) demultiplexing the base layer and the enhancement layer from the mixed bitstream received by the scalable lossless audio decoding apparatus;
- (b) decoding the base layer that is separated from the demultiplexing unit and restoring the audio signal;
- (c) decoding the enhancement layer that is separated from the demultiplexing unit and restoring the lossy signal, wherein the decoding comprises:
  - (c1) restoring the lossless bitstream and restoring an error signal,
  - (c2) predicting an original signal based on the error signal that is restored in step (c1), and
  - (c3) adding the restored error signal to the predicted original signal to generate the restored lossy signal; and
- (d) adding the lossy audio signal that is restored in step (a) to the lossy signal that is restored in step (c) and restoring a lossless audio signal.

12. The method as claimed in claim 11, wherein lossy decoding is implemented using a bit sliced arithmetic coding (BSAC) decoder.

13. A physical recording medium on which the scalable lossless audio decoding method as claimed in claim 11 is recorded as a computer executable program code that can be executed by a computer to carry out the steps of the method.

14. A scalable lossless audio decoding apparatus for decoding an audio signal from a bitstream in which a lossy bitstream, in which the audio signal is lossy coded as a base layer, and a lossless bitstream, in which a lossy signal that is lost when the audio signal is lossy coded is lossless coded as an enhancement layer, are mixed together, the apparatus comprising:
- a demultiplexing unit which demultiplexes the base layer and the enhancement layer from the mixed bitstream;
- a lossy decoding unit which decodes the base layer that is separated from the demultiplexing unit and restores a lossy audio signal;
- a lossless decoding unit which decodes the enhancement layer that is separated from the demultiplexing unit and restores the lossy signal, wherein the lossless decoding unit comprises:
- a lossless decoder which restores the lossless bitstream and restores an error signal,
- a predictor which predicts an original signal based on the error signal that is restored by the lossless decoder, and
- a first signal generator which adds the restored error signal to the predicted original signal to generate the restored lossy signal; and
- a signal generator which adds the lossy audio signal that is restored by the lossy decoding unit to the lossy signal that is restored by the lossless decoding unit, restores a lossless audio signal, and selectively generates one of the restored lossy audio signal and the restored lossless audio signal.

15. A scalable lossless audio decoding method performed by a scalable lossless audio decoding apparatus for decoding an audio signal from a bitstream in which a lossy bitstream, in which the audio signal is lossy coded as a base layer, and a lossless bitstream, in which a lossy signal that is lost when the audio signal is lossy coded is lossless coded as an enhancement layer, are mixed together, the method comprising:
- (a) demultiplexing the base layer and the enhancement layer from the mixed bitstream received by the scalable lossless audio decoding apparatus;
- (b) decoding the base layer that is separated in step (a) and restoring a lossy audio signal;
- (c) decoding the enhancement layer that is separated in step (a) and restoring the lossy signal, wherein the decoding comprises:
  - (c1) restoring the lossless bitstream and restoring an error signal,
  - (c2) predicting an original signal based on the error signal that is restored in step (c1), and
  - (c3) adding the restored error signal to the predicted original signal to generate the restored lossy signal; and
- (d) adding the lossy audio signal that is restored in step (b) to the lossy signal that is restored in step (c), restoring a lossless audio signal, and selectively generates one of the restored lossy audio signal and the restored lossless audio signal.

* * * * *

UNITED STATES PATENT AND TRADEMARK OFFICE
CERTIFICATE OF CORRECTION

PATENT NO. : 7,617,097 B2 Page 1 of 1
APPLICATION NO. : 10/366348
DATED : November 10, 2009
INVENTOR(S) : Doh-Hyung Kim et al.

It is certified that error appears in the above-identified patent and that said Letters Patent is hereby corrected as shown below:

Column 6, Claim 1, Line 8, change "comprises;" to --comprises:--.

Signed and Sealed this

Second Day of March, 2010

David J. Kappos
*Director of the United States Patent and Trademark Office*